US012765149B2

(12) United States Patent
Cheng et al.

(10) Patent No.: US 12,765,149 B2
(45) Date of Patent: Oct. 13, 2026

(54) DISPLAY DEVICE, MANUFACTURING METHOD THEREOF AND MANUFACTURING EQUIPMENT FOR FORMING THE SAME

(71) Applicant: LITE-ON TECHNOLOGY CORPORATION, Taipei (TW)

(72) Inventors: Yuan-Ju Cheng, Taipei (TW); Wei-Ling Hua, Taipei (TW); Yu-Hsien Wu, Taipei (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 431 days.

(21) Appl. No.: 18/204,961

(22) Filed: Jun. 2, 2023

(65) Prior Publication Data

US 2024/0030372 A1 Jan. 25, 2024

Related U.S. Application Data

(60) Provisional application No. 63/391,072, filed on Jul. 21, 2022.

(30) Foreign Application Priority Data

Apr. 25, 2023 (CN) ......................... 202310455543.1

(51) Int. Cl.
*H01L 33/00* (2010.01)
*H10H 20/833* (2025.01)
(Continued)

(52) U.S. Cl.
CPC .......... *H10H 29/24* (2025.01); *H10H 20/833* (2025.01); *H10W 90/00* (2026.01)

(58) Field of Classification Search
CPC .......... H01L 21/67742; H01L 25/0753; H10H 20/8506; H10H 20/036; H10H 20/0363;
(Continued)

(56) References Cited

U.S. PATENT DOCUMENTS

2019/0198483 A1* 6/2019 Wang .................... H10W 90/00
2019/0221550 A1* 7/2019 Harada ................. H10W 90/00
2020/0357967 A1* 11/2020 Oh ........................ H10H 20/857

FOREIGN PATENT DOCUMENTS

CN 109887950 A 6/2019
TW 200739962 A 10/2007
WO WO 2020/233298 A1 11/2020

OTHER PUBLICATIONS

Office Action issued by Taiwan Intellectual Property Office on Apr. 26, 2024.

* cited by examiner

*Primary Examiner* — Elmito Breval
(74) *Attorney, Agent, or Firm* — WPAT, PC

(57) ABSTRACT

A display device includes a substrate, a plurality of electrical connection groups, a plurality of light-emitting elements, a light-transmitting plate, and an adhesive layer. The electrical connection groups may be formed in the substrate. The light-emitting elements may be disposed on the substrate. Each of the light-emitting elements may be electrically connected to the corresponding electrical connection group. The light-transmitting plate may cover the light-emitting elements. The adhesive layer may be formed between the light-transmitting plate and each of the light-emitting elements.

9 Claims, 13 Drawing Sheets

(51) Int. Cl.
*H10H 29/24* (2025.01)
*H10W 90/00* (2026.01)

(58) Field of Classification Search
CPC ............ H10H 20/0364; H10H 20/857; H10H 20/853; H10H 20/01; H10H 20/855; H10H 20/018; H10D 86/441; H10D 86/60
See application file for complete search history.

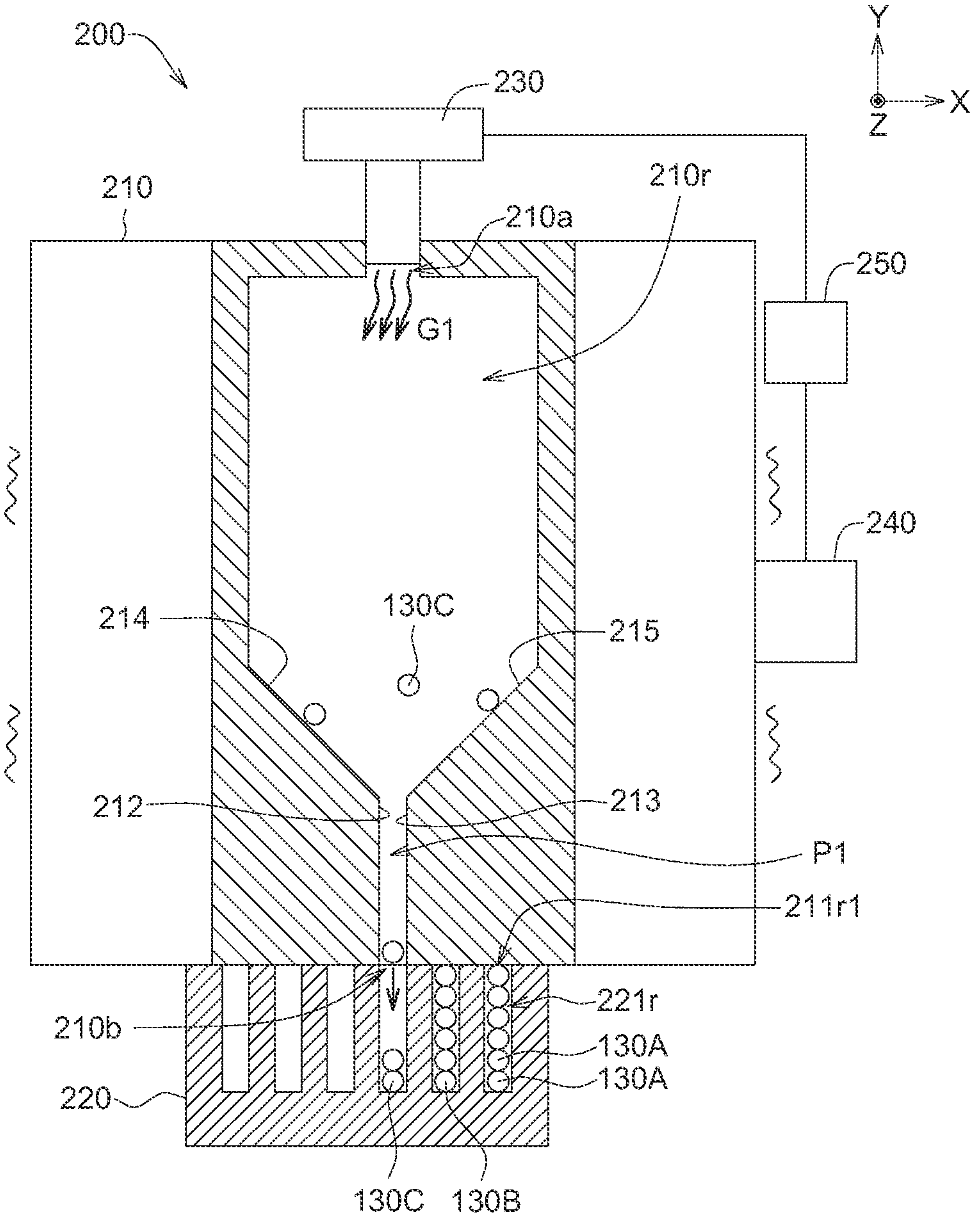
FIG. 3A1
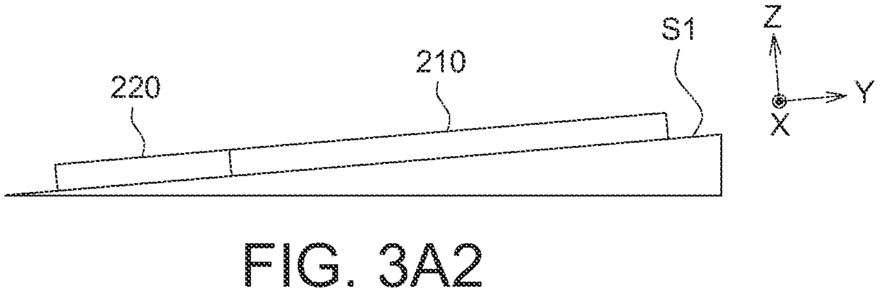
FIG. 3A2

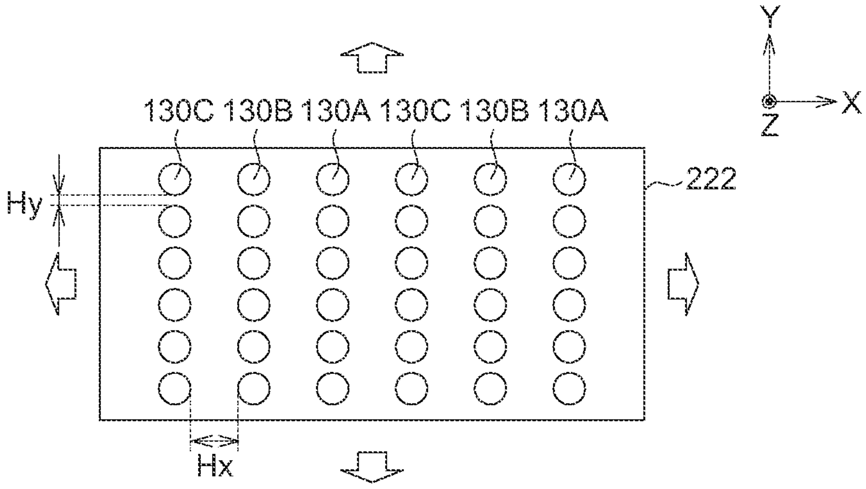
FIG. 3D1
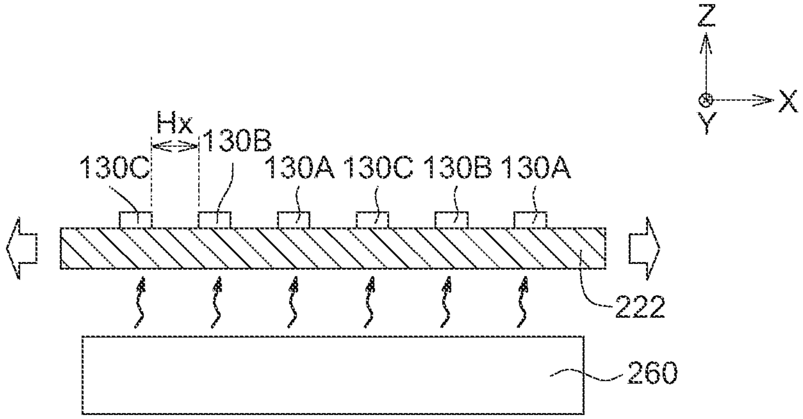
FIG. 3D2

DISPLAY DEVICE, MANUFACTURING METHOD THEREOF AND MANUFACTURING EQUIPMENT FOR FORMING THE SAME

This application claims the benefit of U.S. Provisional application Ser. No. 63/391,072, filed Jul. 21, 2022, the disclosure of which is incorporated by reference herein in its entirety, and claims the benefit of People's Republic of China application Serial No. 202310455543.1, filed on Apr. 25, 2023, the subject matter of which is incorporated herein by reference.

FIELD OF THE INVENTION

The invention relates to a display device, a manufacturing method thereof and a manufacturing equipment for forming the same.

BACKGROUND OF THE INVENTION

In the mass transfer process of micro-LEDs, a pitch of Micro LEDs is generally controlled by stretching tape. Under the requirement of high-density arrangement of micro-LEDs, the requirement for a pitch between micro-LEDs is getting smaller and smaller. However, the stretching method easily causes an excessive error. In addition, in the process of transferring the micro-LEDs by rollers, the micro-LEDs are easily damaged due to the problem of pressure control. Therefore, how to improve the aforementioned problems is one of the directions which those skilled in the art put the efforts in.

SUMMARY OF THE INVENTION

In an embodiment of the invention, a display device is provided. The display device includes a substrate, a plurality of electrical connection groups, a plurality of light-emitting elements, a light-transmitting plate and an adhesive layer. The electrical connection groups are formed in the substrate. The light-emitting elements are disposed on the substrate, wherein each of the light-emitting elements is electrically connected to the corresponding electrical connection group. The light-transmitting plate covers the light-emitting elements. The adhesive layer formed between the light-transmitting plate and each of the light-emitting elements.

In another embodiment of the invention, a manufacturing method of a display device is provided. The manufacturing method includes the following steps: providing a feeding device, wherein the feeding device has an accommodating portion, an inlet and an outlet, the inlet and the outlet communicate with the accommodating portion, and the accommodating portion is configured to accommodate a plurality of light-emitting elements; providing a carrying device to dispose adjacent to the outlet of the feeding device, wherein the carrying device includes a first heat conducting plate and a groove structure, the groove structure is combined with the first heat conducting plate, and the groove structure has a plurality of grooves; and controlling an air blowing device to provide an airflow into the accommodating portion of the feeding device from the inlet for driving the light-emitting elements to enter the grooves through the outlet.

In another embodiment of the invention, a manufacturing equipment for a display device is provided. The manufacturing equipment includes a feeding device, a carrying device and an air blowing device. The feeding device has an accommodating portion, an inlet and an outlet, wherein the inlet and the outlet communicate with the accommodating portion, and the accommodating portion is configured for accommodating a plurality of light-emitting elements. The carrying device is disposed adjacent to the outlet of the feeding device, and includes a groove structure, wherein the groove structure has a plurality of grooves, and the grooves are configured to accommodate the light-emitting elements. The air blowing device communicates with the inlet and configured to provide an airflow into the accommodating portion of the feeding device from the inlet for driving the light-emitting elements to enter the grooves through the outlet.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which:

FIG. 3A1 shows a schematic diagram of the accommodating portion of the feeding device of FIG. 2C in which a plurality of light-emitting elements are accommodated;

FIG. 3A2 shows a schematic diagram of the feeding device of FIG. 3A1 disposed obliquely;

FIG. 3B1 shows a schematic diagram of the carrying device of FIG. 3A1 carrying the light-emitting elements;

FIG. 3B2 shows a schematic diagram of a cross-sectional view of the carrying device of FIG. 3B1 along a direction 3B2-3B2';

FIGS. 3D1 and 3D2 show schematic diagrams of the first heat conducting plate of FIG. 3C being heated;

DETAILED DESCRIPTION OF PREFERRED EMBODIMENTS

Figure 1A:
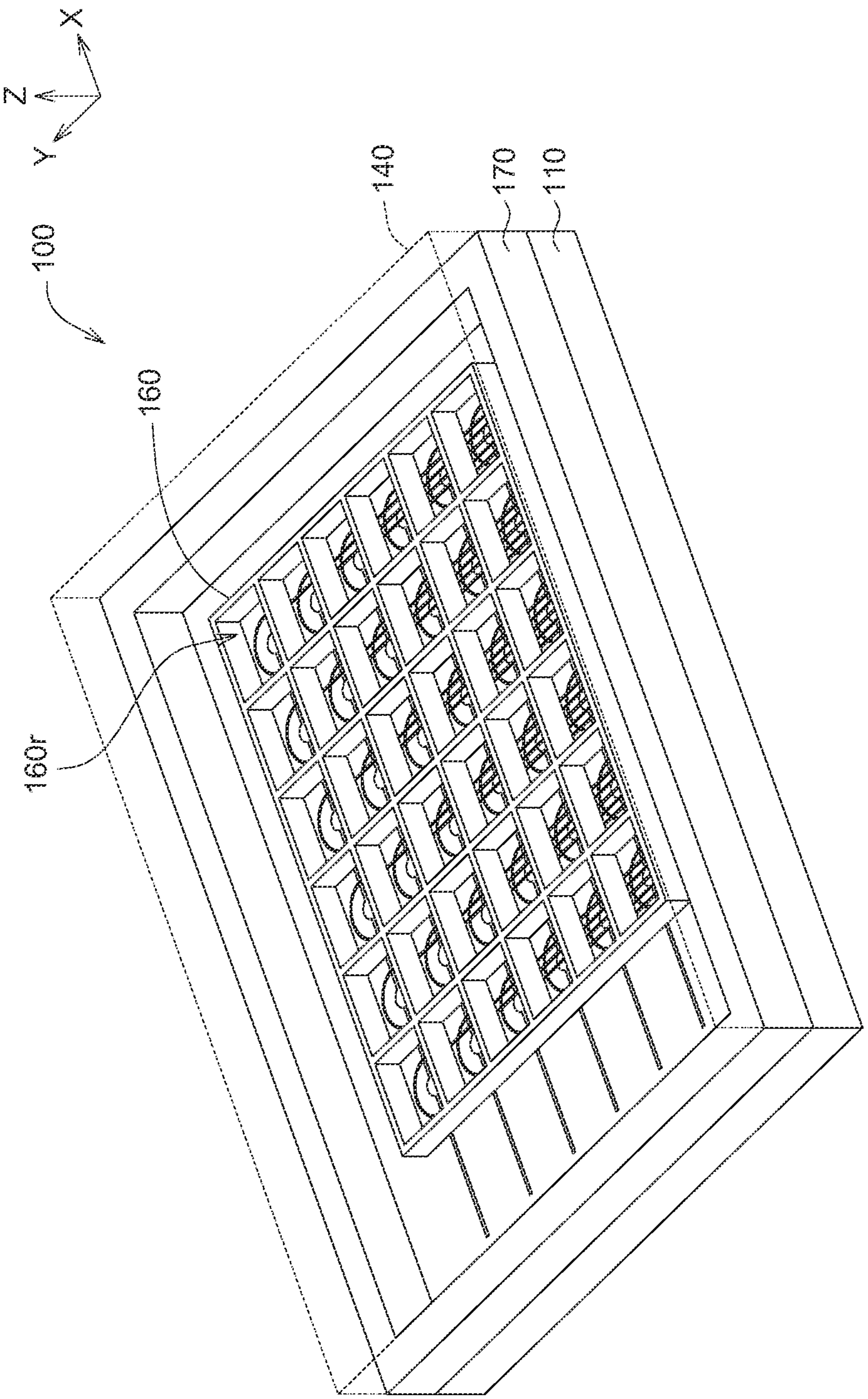
FIG. 1A shows a schematic diagram of a perspective view of a display device according to an embodiment of the present invention.
Figure 1B:
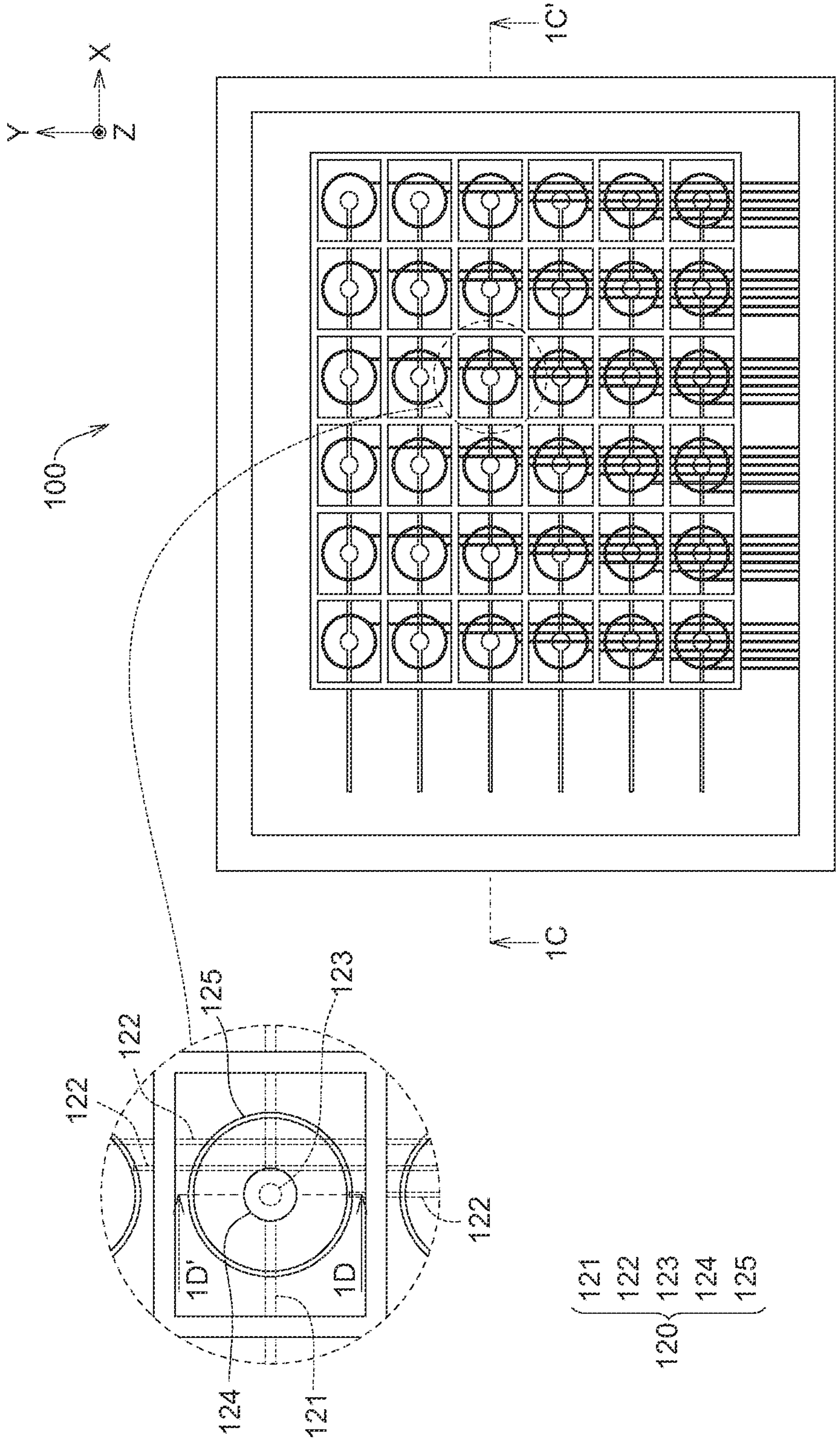
FIG. 1B shows a schematic diagram of a top view of the display device in FIG. 1A.
Figure 1C:
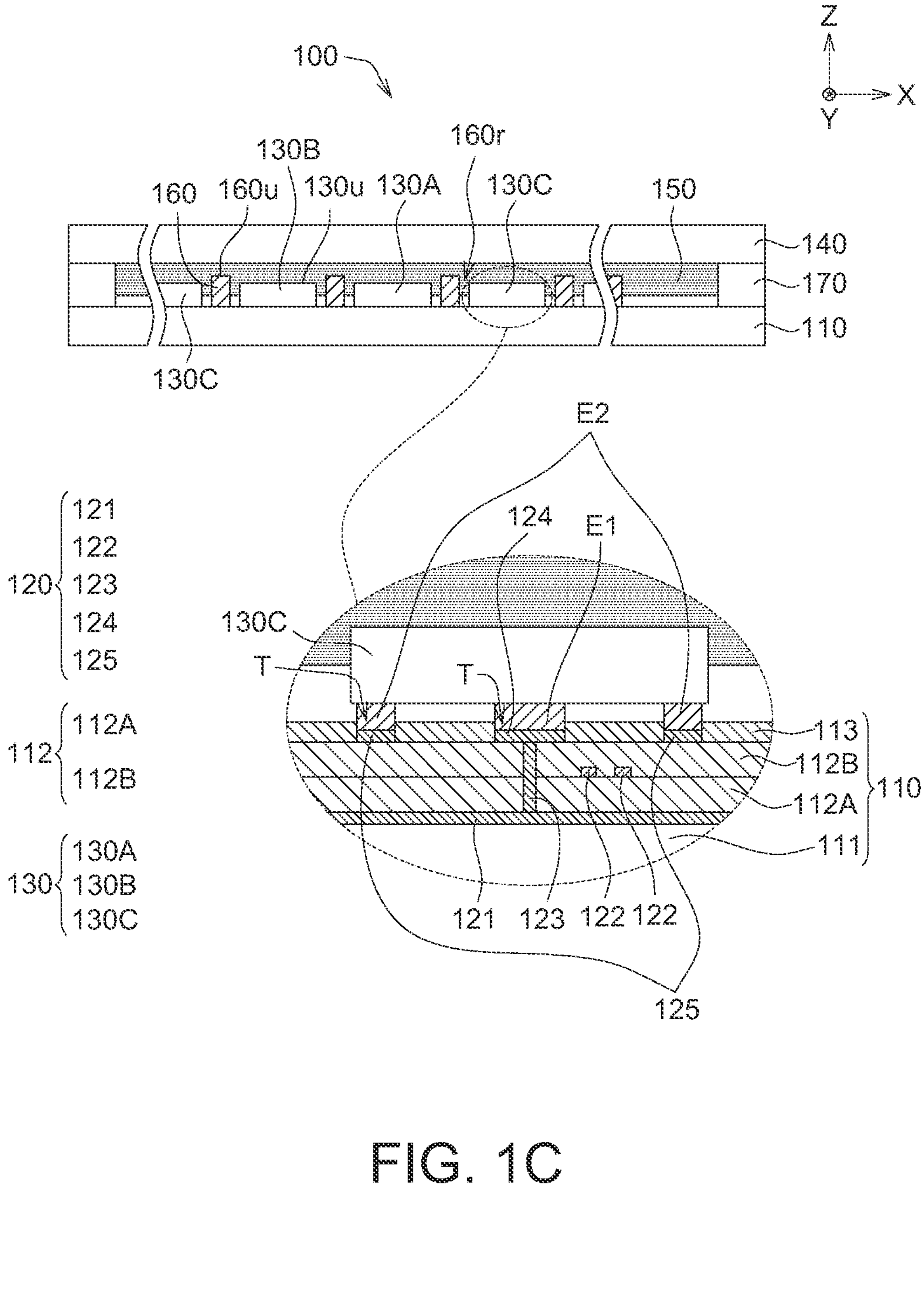
FIG. 1C shows a schematic diagram of a cross-sectional view of the display device in FIG. 1B along a direction 1C-1C'.
Figure 1D:
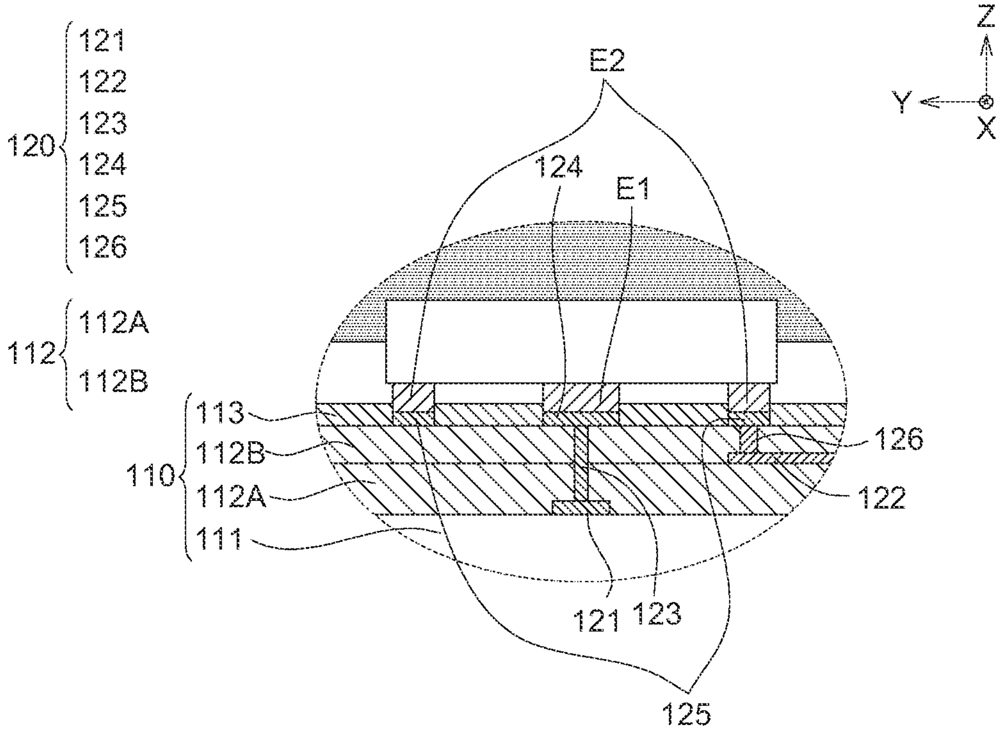
FIG. 1D shows a schematic diagram of a cross-sectional view of the display device in FIG. 1B along a direction 1D-1D'.
Figure 1E:
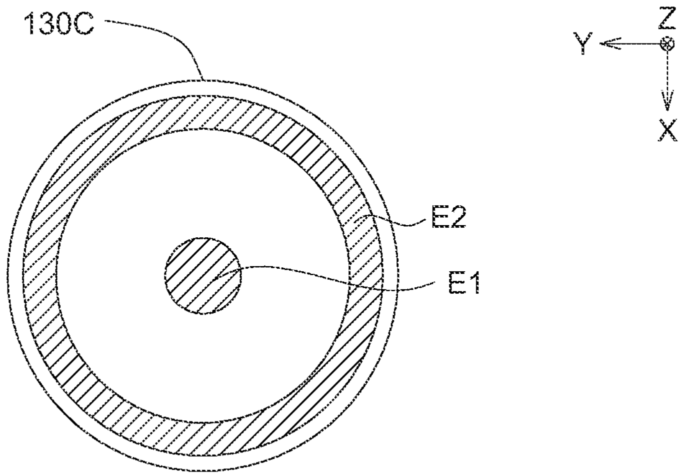
FIG. 1E shows a schematic diagram of a bottom view of a light-emitting element in FIG. 1C.

Referring to FIGS. 1A to 1E, FIG. 1A shows a schematic diagram of a perspective view of a display device 100 according to an embodiment of the present invention, FIG. 1B shows a schematic diagram of a top view of the display device 100 in FIG. 1A, and FIG. 1C shows a schematic diagram of a cross-sectional view of the display device 100 in FIG. 1B along a direction 1C-1C', FIG. 1D shows a schematic diagram of a cross-sectional view of the display device 100 in FIG. 1B along a direction 1D-1D', and FIG. 1E shows a schematic diagram of a bottom view of a light-emitting element 130C in FIG. 1C. In order to clearly show an electrical connection group, FIGS. 1A and 1B do not show the light-emitting element 130, and FIG. 1B does not show the light-transmitting plate 140.

As shown in FIGS. 1C to 1D, the display device 100 includes a substrate 110, a plurality of electrical connection groups 120, a plurality of light-emitting elements 130 (for example, at least one light-emitting element 130A, at least one light-emitting element 130B and at least one light-emitting element 130C), the light-transmitting plate 140, an adhesive layer 150, a patterned light-shielding layer 160 and a sealant 170. These electrical connection groups 120 are formed in the substrate 110. The light-emitting elements 130 are disposed on the substrate 110, and each light-emitting element 130 is electrically connected to the corresponding electrical connection group 120. The light-transmitting plate 140 covers the light-emitting elements 130. The adhesive layer 150 is formed between the light-transmitting plate 140 and each light-emitting element 130.

As shown in FIGS. 1C and 1D, the substrate 110 includes a base 111, at least one dielectric layer 112 (for example, including a dielectric layer 112A and a dielectric layer 112B) and a passivation layer 113. The material of the base 111 is, for example, a silicon wafer or a light-transmitting material such as glass. The dielectric layer 112 is formed in the base 111 to electrically isolate a first transmission line 121 and a second transmission line 122 in the substrate 110 for preventing these transmission lines from being electrically shorted. The dielectric layer 112 could be a single-layered dielectric layer, or a multi-layered dielectric layer (for example, the dielectric layer 112A and the dielectric layer 112B shown in FIGS. 10 and 1D). The passivation layer 113 is formed on the dielectric layer 112.

As shown in FIG. 1B to FIG. 1D, each electrical connection group 120 includes the first transmission line 121, the second transmission line 122, a first conductive hole 123, a first pad 124, a second pad 125 and a second conductive hole 126. A plurality of the electrical connection groups 120 could be connected in series or in parallel. For example, a plurality of the electrical connection groups 120 could be connected in series or in parallel with transmission lines (the first transmission line 121 and the second transmission line 122). The first transmission line 121 could extend in the X axis, and the second transmission line 122 could extend in the Y axis. In all figures, the X axis, the Y axis and the Z axis are perpendicular to each other. In an embodiment, the first transmission line 121 and the second transmission line 122 may not be parallel to the X-axis and the Y-axis, and an angle between the first transmission line 121 and the second transmission line 122 could be less than 90 degrees so that the routing of the transmission line has a high degree of freedom (routing flexibility).

As shown in FIGS. 1C and 1D, the first transmission line 121 and the second transmission line 122 are non-coplanar so that the first transmission line 121 and the second transmission line 122 could be separated to prevent an electrical short circuit. In the present embodiment, the first transmission line 121 and the second transmission line 122 are staggered up and down, and the dielectric layer 112A separates the first transmission line 121 from the second transmission line 122. The dielectric layer 112A could cover the first transmission line 121, and the dielectric layer 112B could cover the second transmission line 122. In another embodiment, the first transmission line 121 could be embedded in the dielectric layer 112A, and the second transmission line 122 could be embedded in the dielectric layer 112B. The dielectric layer 112A and the dielectric layer 112B could be formed by different processes. For example, the forming process of the dielectric layer 112A and the forming process of the dielectric layer 112B are separated by another element forming process. In another embodiment, the first transmission line 121 and the second transmission line 122 are embedded in the same dielectric layer, and are staggered up and down in the dielectric layer for the electrical isolation.

As shown in FIGS. 10 and 1D, the first conductive hole 123 penetrates through the dielectric layers 112A and 112B to connect the first transmission line 121 with the first pad 124. In the present embodiment, the second transmission line 122 is connected to the second pad 125. For example, the second conductive hole 126 penetrates through the dielectric layer 112B, and the second transmission line 122 is indirectly connected to the second pad 125 through the second conductive hole 126. In another embodiment, the second transmission line 122 is directly connected to the second pad 125. The first pad 124 and the second pad 125 could be formed on an upper surface of the dielectric layer 112. The passivation layer 113 covers the dielectric layer 112 and forms a trench T exposing the first pad 124 and the second pad 125. The trench T could make a first electrode E1 and a second electrode E2 of the light-emitting element 130 electrically connect the exposed first pad 124 and second pad 125 more accurately when the light-emitting element 130 is disposed on the substrate 110. As a result, the signal could be transmitted to the light-emitting element 130 through the first transmission line 121, the second transmission line 122, the first conductive hole 123, the first pad 124 and the second pad 125 in the substrate 110.

As shown in FIG. 1B, the first pad 124 is, for example, a circle, an ellipse, or a polygon, wherein the polygon includes a rectangle or a polygon with other geometric shapes. The second pad 125 is, for example, a ring shape which surrounds the first pad 124. In an embodiment, the second pad 125 closely (e.g., 360 degrees) or openly (e.g., less than 360 degrees) surrounds the first pad 124. In another embodiment, the second pad 125 could conformally surround the first pad 124. The second pad 125 could be shaped as a circle, an ellipse or a polygon, and the polygon includes a rectangle or a polygon with other geometric shapes. In the present embodiment, the first pad 124 and the second pad 125 are disposed concentrically. In another embodiment, the first pad 124 and the second pad 125 could be disposed eccentrically.

As shown in FIG. 10, the light-emitting elements 130A to 130C are, for example, micro-LEDs. In an embodiment, the micro-LED could have a size (for example, outer diameter, length or width) less than or equal to 25 micrometers (μm), but the present invention is not limited thereto. In another embodiment, the micro-LED could have a size (for example, outer diameter, length or width) greater than 25 μm and less than 100 μm. The light-emitting element 130A could emit one of a first color light, a second color light and a third color light, the light-emitting element 130B could emit another of the first color light, the second color light and the third color light, and the light-emitting element 130C could emit the other of the first color light, the second color light and the third color light, wherein the first color light, the second color light and the third color light have different colors. In an embodiment, the first color light, the second color light and the third color light are red light, green light and blue light respectively. In another embodiment, the light-emitting elements 130A to 130C could emit the lights with the same color.

As shown in FIGS. 10 and 1D, each light-emitting element 130 has the first electrode E1 and the second electrode E2, and the first electrode E1 and the second electrode E2 are disposed on the same side of the light-emitting element 130. Take the light-emitting element 130C as an example, the light-emitting element 130C includes a first electrode E1 and a second electrode E2, and the first electrode E1 and the second electrode E2 are disposed on the same surface of the light-emitting element 130C. The first electrode E1 and the second electrode E2 could be disposed on the dielectric layer 112. For example, when the light-emitting element 130 is disposed on the substrate 110, the first electrode E1 and the second electrode E2 of the light-emitting element 130 are respectively connected to the first pad 124 and the second pad 125 disposed on the dielectric layer 112. The first electrode E1 of the light-emitting element 130 is electrically connected to the first transmission line 121 through the first pad 124 and the first conductive hole 123 of the electrical connection group 120, and the second electrode E2 of the light-emitting element 130 is electrically connected to the second transmission line 122 through the second pad 125. In an embodiment, when the light-emitting element 130 is disposed on the substrate 110, the first electrode E1 and the second electrode E2 are compressed and deformed to fill the trench T, and then the first electrode E1 and the second electrode E2 contact the first pad 124 and the second pad 125 at the bottom of the trench T for the first electrode E1 and the second electrode E2 being respectively electrically connected to the electrical connection group 120 more stably. The first electrode E1 and the second electrode E2 are metal layers, such as gold-plated layers.

As shown in FIG. 1E, the first electrode E1 and the second electrode E2 of the light-emitting element 130C have shapes the same as or similar to that of the first pad 124 and the second pad 125 respectively. In other words, the first electrode E1 is, for example, a circle, an ellipse or a polygon, wherein the polygon includes a rectangle or a polygon with other geometric shapes. The second electrode E2 is, for example, a ring shape which surrounds the first electrode E1. For example, the second electrode E2 closely (e.g., 360 degrees) or openly (e.g., less than 360 degrees) surrounds the first electrode E1. In an embodiment, the second electrode E2 could conformally surround the first electrode E1. The second electrode E2 could be shaped as a circle, an ellipse or a polygon, and the polygon includes a rectangle or a polygon with other geometric shapes. In the present embodiment, the first electrode E1 and the second electrode E2 are disposed concentrically. In another embodiment, the first electrode E1 and the second electrode E2 could be disposed eccentrically. In an embodiment, a lower surface area of the first electrode E1 is larger than an upper surface area of the first pad 124, and a lower surface area of the second electrode E2 is larger than an upper surface area of the second pad 125. As a result, even if the first electrode E1 and the second electrode E2 are not completely aligned with the first pad 124 and the second pad 125 when the light-emitting element 130 is disposed on the substrate 110, the first electrode E1 and the second electrode E2 still can contact the first pad 124 and the second pad 125 at the bottom of the trench T because the second electrode E2 is compressed and deformed to fill the trench T. As a result, the first electrode E1 and the second electrode E2 are respectively electrically connected to the electrical connection group 120 stably.

Since the second electrode E2 and the second pad 125 are ring shapes, the connection between the light-emitting element 130 and the electrical connection group 120 does not need to consider the directionality. Furthermore, even if the light-emitting element 130 and the electrical connection group 120 rotate relatively (for example, rotate around the Z-axis) during the connecting process, as long as the first electrode E1 of the light-emitting element 130 and the first pads 124 of the electrical connection group 120 are connected, the second electrode E2 of the light-emitting element 130 and the second pad 125 of the electrical connection group 120 also could be connected. As a result, the light-emitting element 130 could be electrically connected to the electrical connection group 120 more easily.

As shown in FIG. 10, the light-transmitting plate 140 abuts on the sealant 170 and covers the substrate 110, the light-emitting elements 130A to 130C, the adhesive layer 150 and the sealant 170. The light-transmitting plate 140 is, for example, a glass carrier.

As shown in FIGS. 1A and 10, the patterned light-shielding layer 160 is formed on the substrate 110 and has a plurality of recesses 160*r*, and each recess 160*r* accommodates the corresponding light-emitting element 130. The patterned light-shielding layer 160 is, for example, formed of an opaque material, which can block or absorb light leakage. Specifically, the patterned light-shielding layer 160 is, for example, a black matrix (BM). The patterned light-shielding layer 160 has a first top surface 160*u*, and each light-emitting element 130 has a second top surface 130*u*. The first top surface 160*u* is higher than each second top surface 130*u*. As a result, it can prevent the adhesive layer 150 from excessively pressing the light-emitting element 130, and can block the light of each light-emitting element 130 to prevent it from leaking to the adjacent recess 160*r*, thereby avoiding the light leakage to negatively affect the adjacent light-emitting elements 130. For example, it could avoid mutual interference of lights of different colors.

As shown in FIG. 10, the sealant 170 combines the substrate 110 with the light-transmitting plate 140, and surrounds the light-emitting elements 130. The sealant 170 could be formed of a light-transmitting material or a light-shielding material. The sealant 170 could seal the space between the substrate 110 and the light-transmitting plate 140 for preventing external impurities from invading the light-emitting element 130.

A manufacturing equipment 200 for manufacturing the display device 100 will be described below.

Figure 2A:
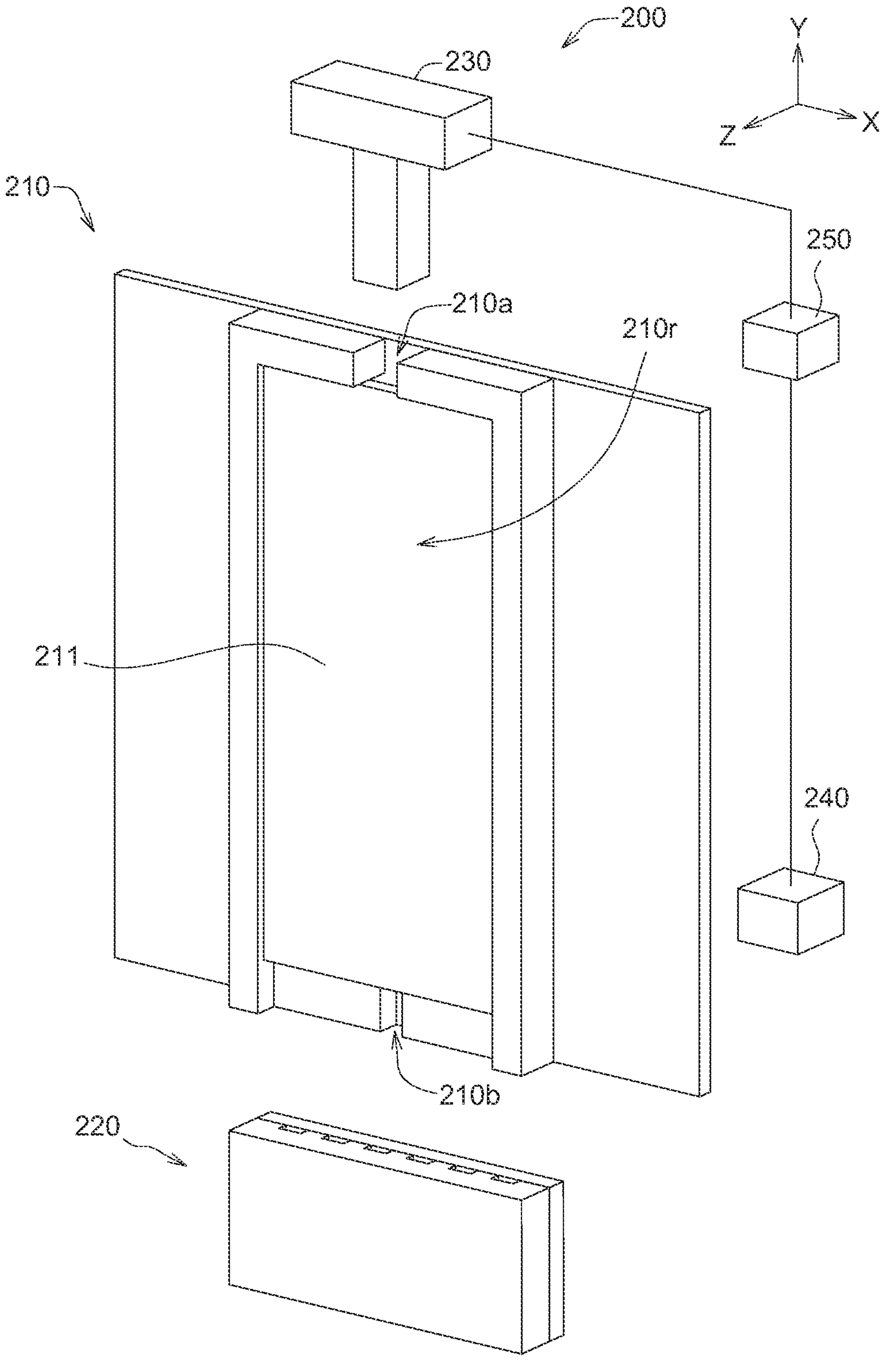
FIG. 2A shows a schematic diagram of an exploded view of a manufacturing equipment according to an embodiment of the present invention.
Figure 2B:
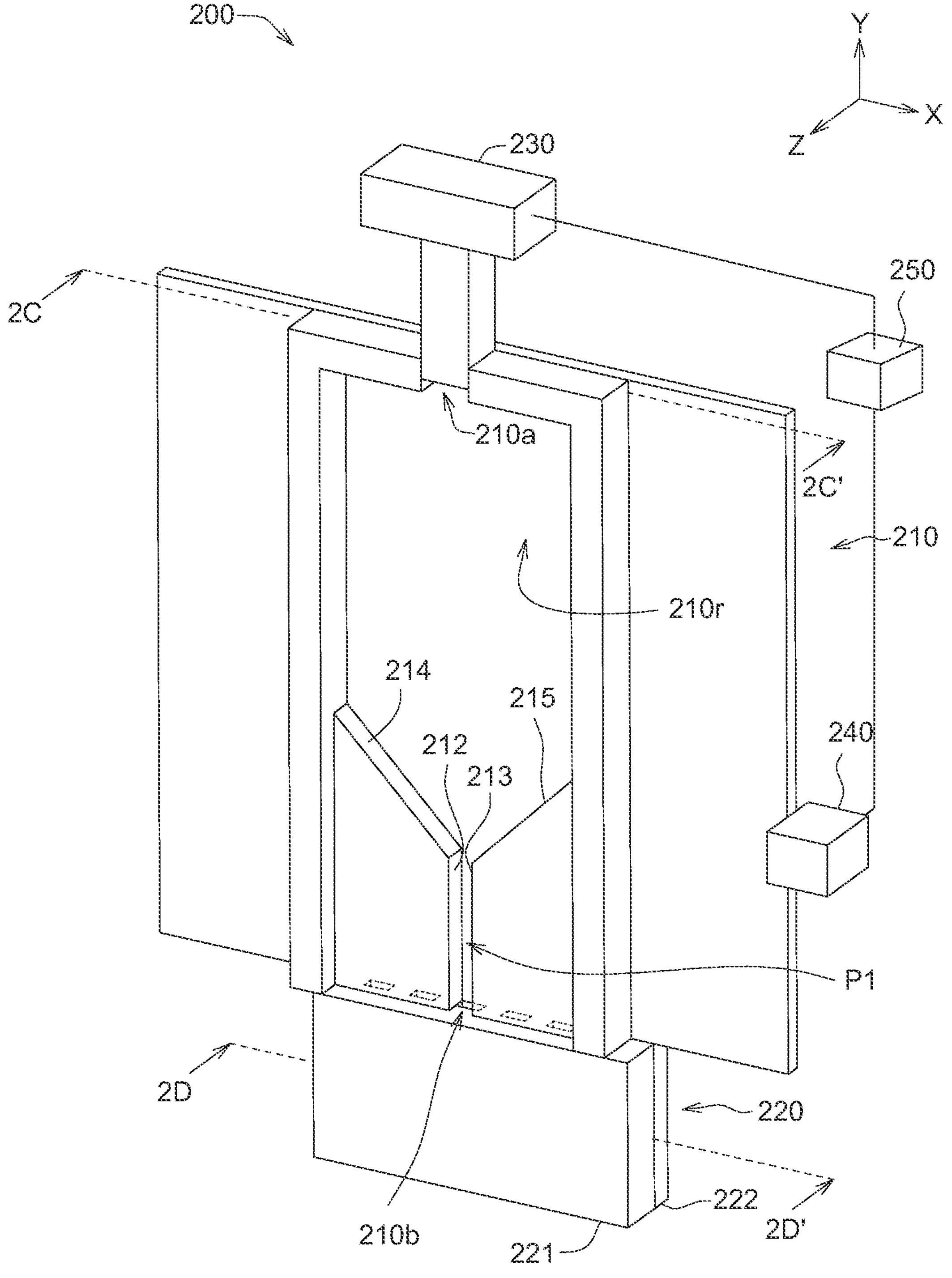
FIG. 2B shows a schematic diagram of an assembled view of the manufacturing device of FIG. 2A (the baffle plate is not shown)
Figure 2C:
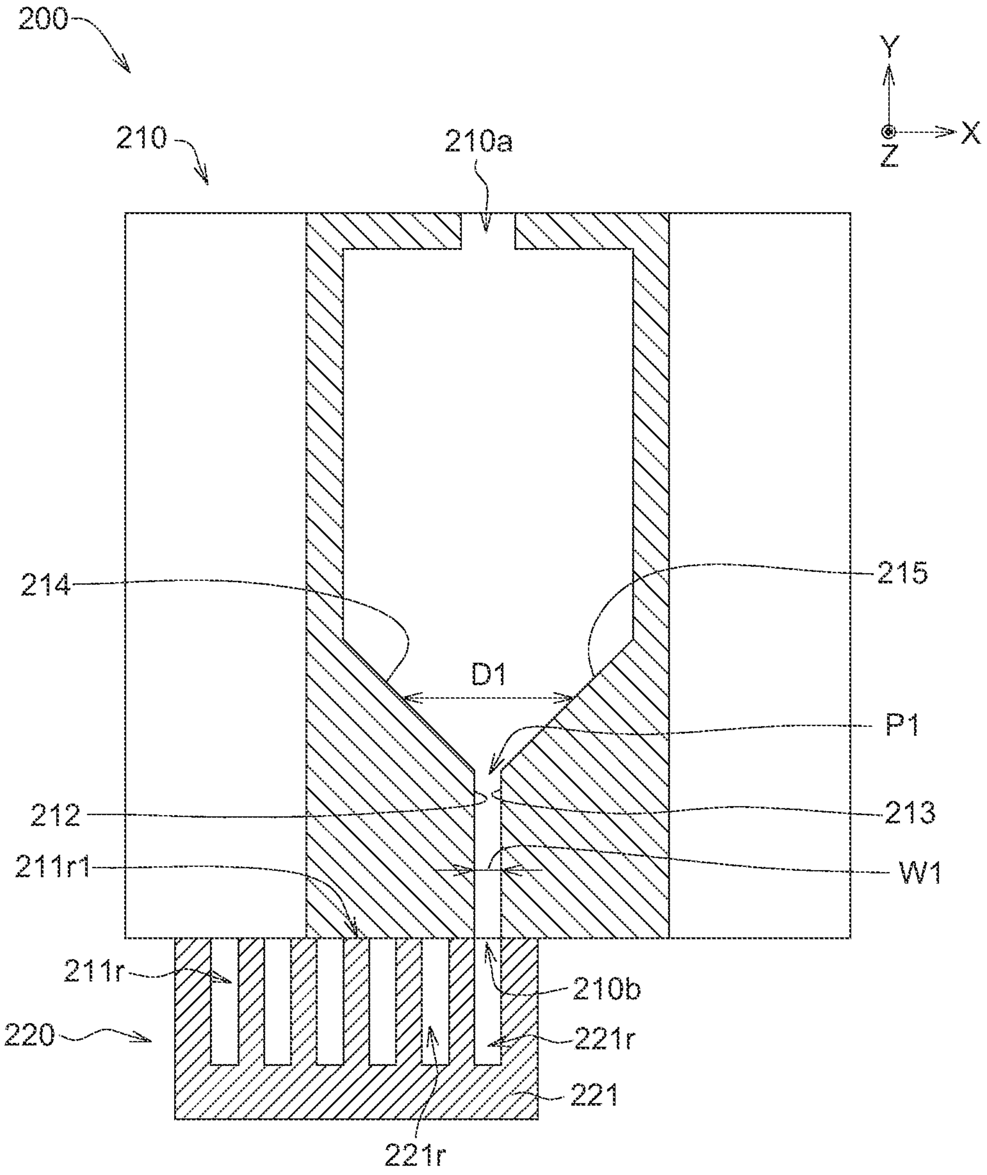
FIG. 2C shows a schematic diagram of a cross-sectional view of a feeding device and a carrying device of the manufacturing equipment along a direction 2C-2C'.
Figure 2D:
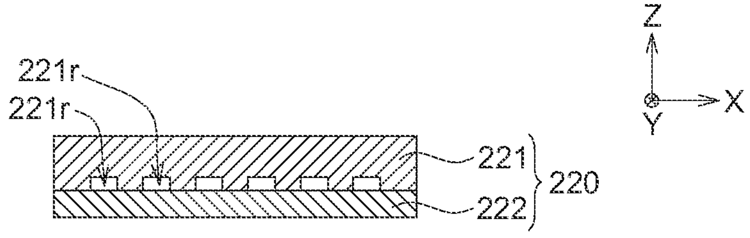
FIG. 2D is a schematic diagram of a cross-sectional view of the carrying device of the manufacturing equipment of FIG. 2B along a direction 2D-2D'.

Referring to FIGS. 2A to 2D, FIG. 2A shows a schematic diagram of an exploded view of a manufacturing equipment 200 according to an embodiment of the present invention, FIG. 2B shows a schematic diagram of an assembled view of the manufacturing device 200 of FIG. 2A (the baffle plate 211 is not shown), FIG. 2C shows a schematic diagram of a cross-sectional view of a feeding device 210 and a carrying device 220 of the manufacturing equipment 200 along a direction 2C-2C', and FIG. 2D is a schematic diagram of a cross-sectional view of the carrying device 220 of the manufacturing equipment 200 of FIG. 2B along a direction 2D-2D'.

As shown in FIG. 2A, the manufacturing equipment 200 includes the feeding device 210, the carrying device 220, an air blowing device 230, a vibrator 240 and a controller 250.

As shown in FIGS. 2A and 2B, the feeding device 210 includes a baffle plate 211, an accommodating portion 210*r*, an inlet 210*a* and an outlet 210*b*, wherein the inlet 210*a* and the outlet 210*b* communicate with the accommodating portion 210*r*, and the accommodating portion 210*r* is configured to accommodate a plurality of the light-emitting elements 130 (not shown). The baffle plate 211 could cover the accommodating portion 210*r*. For example, the baffle plate 211 covers an opening of the accommodating portion 210*r* facing the Z-axis, so as to prevent the light-emitting element 130 disposed within the accommodating portion 210*r* from leaving the feeding device 210 through the opening of the accommodating portion 210*r* facing the Z-axis.

As shown in FIGS. 2B and 2C, the feeding device 210 further includes a first channel wall 212, a second channel wall 213, a first guide wall 214 and a second guide wall 215. The first channel wall 212, the second channel wall 213, the first guide wall 214 and the second guide wall 215 are disposed in the accommodating portion 210*r*. There is a channel P1 formed between the first channel wall 212 and the second channel wall 213, and the channel P1 communicates with the outlet 210*b*. The first guide wall 214 is connected adjacent to the first channel wall 212, and the second guide wall 215 is adjacent to the second channel wall 213. A distance D1 between the first guide wall 214 and the second guide wall 215 gradually narrows in a direction from the inlet 210*a* toward the channel P1 so that the first guide wall 214 and/or the second guide wall 215 form an inclined wall. As a result, the first guide wall 214 and the second guide wall 215 could guide the light-emitting element 130 (not shown) to slide into the channel P1. The first guide wall 214 and/or the second guide wall 215 are, for example, plane walls, or curved walls. In addition, the channel P1 has a first width W1 greater than or equal to the second width W2 of each light-emitting element so that the light-emitting elements 130 could pass through the channel P1 smoothly. In an embodiment, the first width W1 could be less than twice the second width W2 of each light-emitting element so that the light-emitting elements 130 falling in the channel P1 are substantially arranged in a single row, and the single row of the light-emitting elements can fall into a single groove 221*r* of the carrying device 220 more precisely.

As shown in FIG. 2B to FIG. 2D, the carrying device 220 is disposed adjacent to the outlet 210*b* of the feeding device 210, and includes a groove structure 221 and a first heat conducting plate 222. The groove structure 221 has a plurality of the grooves 221*r*, wherein each groove 221*r* is configured to accommodate at least one light-emitting element 130 (not shown). The first heat conducting plate 222 is combined with the groove structure 221, and covers the opening of each groove 221*r* facing the Z-axis, and only exposes the opening 221*r*1 facing the Y-axis (towards the feeding device 210). In addition, the first heat conducting plate 222 is, for example, a metal carrier.

As shown in FIG. 2B, the air blowing device 230 could communicate with the inlet 210*a*, and is configured to provide airflow from the inlet 210*a* into the accommodating portion 210*r* of the feeding device 210 so as to drive the light-emitting element 130 (not shown) disposed in the accommodating portion 210*r* to enter into the groove 221*r* through the outlet 210*b*. The vibrator 240 could be connected to the feeding device 210 to control the feeding device 210 to vibrate, and then drive the light-emitting element 130 (not shown) disposed within the accommodating portion 210*r* to enter the groove 221*r* through the outlet 210*b*. The controller 250 is electrically connected to the air blowing device 230 and vibrator 240 to control the operation of these components.

The manufacturing process of the display device 100 is described below.

Figure 3C:
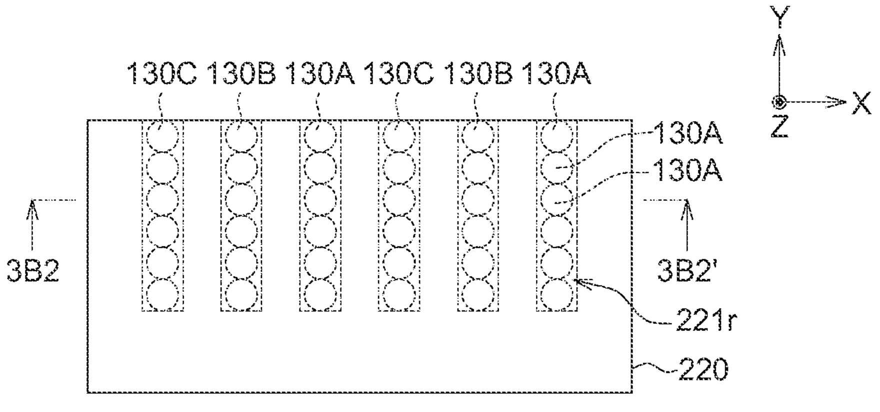
FIG. 3C shows a schematic diagram of the groove structure of FIG. 3B2 being removed.
Figure 3C:
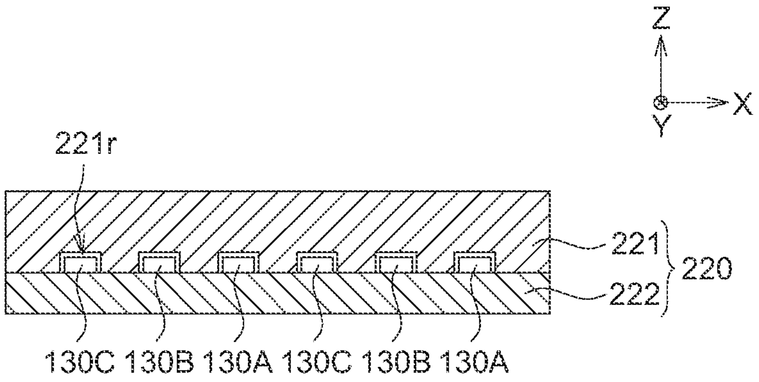
Figure 3C:
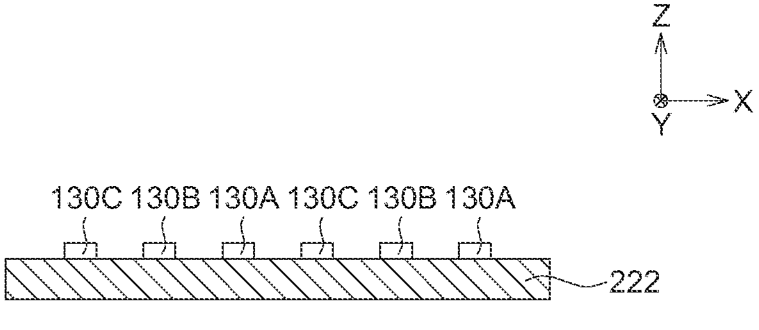
Figure 3E:
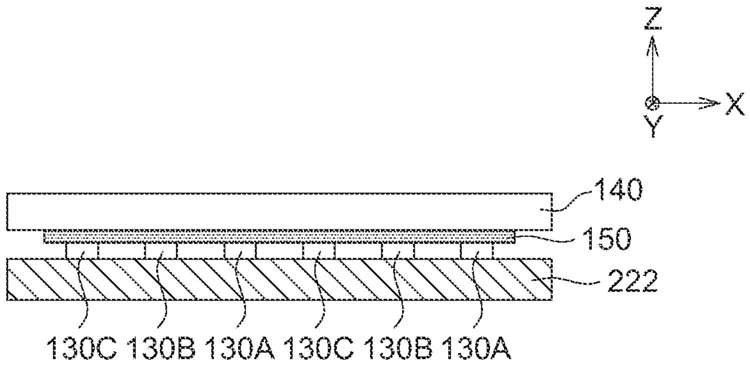
FIGS. 3E and 3F show schematic diagrams of the light-emitting elements of FIG. 3D2 being glued on the light-transmitting plate.
Figure 3F:
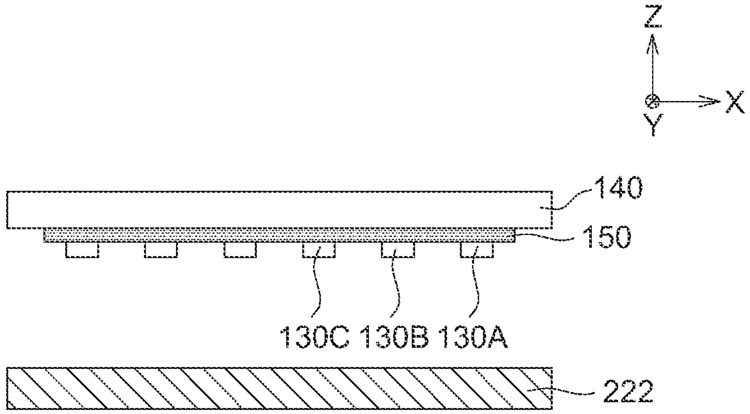
Figure 3G:
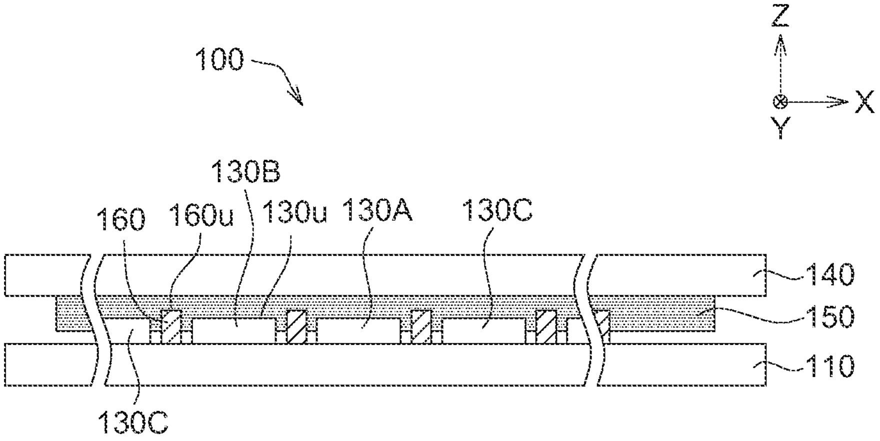
FIG. 3G shows a schematic diagram of transferring the light-emitting elements of FIG. 3F to the substrate.

Referring to FIGS. 3A1 to 3G, FIG. 3A1 shows a schematic diagram of a plurality of the light-emitting elements 130C being accommodated within the accommodating portion 210*r* of the feeding device 210 in FIG. 2C, FIG. 3A2 shows a schematic diagram of the feeding device 210 of FIG. 3A1 disposed obliquely, FIG. 3B1 shows a schematic diagram of the carrying device 220 of FIG. 3A1 carrying the light-emitting elements 130A to 130C, FIG. 3B2 shows a schematic diagram of a cross-sectional view of the carrying device 220 of FIG. 3B1 along a direction 3B2-3B2', FIG. 3C shows a schematic diagram of the groove structure 221 of FIG. 3B2 being removed, FIGS. 3D1 and 3D2 show schematic diagrams of the first heat conducting plate 222 of FIG. 3C being heated, FIGS. 3E and 3F show schematic diagrams of the light-emitting elements 130A to 130C of FIG. 3D2 being glued on the light-transmitting plate 140, and FIG. 3G shows a schematic diagram of transferring the light-emitting elements 130A to 130C of FIG. 3F to the substrate 110.

Firstly, as shown in FIG. 3A1, the feeding device 210 as shown in FIG. 2B is provided. Although not shown, the feeding device 210 of FIG. 3A1 may further include the baffle plate 211, wherein the baffle plate 211 covers the opening of the accommodating portion 210*r* facing the Z-axis.

Then, as shown in FIG. 3A1, a configuration of the carrying device 220 adjacent to the outlet 210*b* of the feeding device 210 as shown in FIG. 2B is provided. For example, the opening 221*r*1 of the groove 221*r* of the groove structure 221 of the carrying device 220 faces the outlet 210*b* of the feeding device 210.

Then, as shown in FIG. 3A1, a plurality of the light-emitting elements 130C are disposed in the accommodating portion 210*r*. In the present embodiment, the light-emitting elements that emit the light of the same color are disposed in the accommodating portion 210*r*, and the light-emitting element 130C is taken as an example in the embodiment of the present invention. As shown in FIG. 3A2, the feeding device 210 and the carrying device 220 are obliquely disposed so that the light-emitting elements 130C could slide toward the guide wall (for example, the first guide wall 214 or the second guide wall 215) or the channel P1 by its own weight. The feeding device 210 and the carrying device 220 may be disposed on an inclined plane S1 to be obliquely disposed. In another embodiment, the feeding device 210 and the carrying device 220 could also be horizontally disposed, that is, not inclined.

Then, as shown in FIG. 3A1, the controller 250 could control the air blowing device 230 to provide an airflow G1 into the accommodating portion 210*r* of the feeding device 210 from the inlet 210*a* so as to drive the light-emitting element 130C to enter the groove 221*r* through the outlet 210*b*. In an embodiment, the controller 250 could control the airflow G1 to enter the accommodating portion 210*r* of the feeding device 210 intermittently from the inlet 210*a*. Through the intermittent airflow, it may prevent the light-emitting element 130C from blocking the channel P1. In another embodiment, if there is no requirement of the airflow, the manufacturing equipment 200 may omit the air blowing device 230, and the light-emitting element 130C may slide into the groove 221*r* through the outlet 210*b* merely by its own weight.

In addition, as shown in FIGS. 3A1 and 3A2, the controller 250 could control the vibrator 240 to drive the feeding device 210 to vibrate so as to drive the light-emitting elements 130C to enter the grooves 221*r* through the outlet 210*b*. Vibration could prevent the light-emitting member 130C from blocking the channel P1. In another embodiment, if there is no need for vibration, the manufacturing equipment 200 may omit the vibrator 240, and the light-emitting element 130C may slide into the groove 221*r* through the outlet 210*b* merely by its own weight. In other embodiments, the air blowing device 230 and the vibrator 240 may be turned on at the same time so that the light-emitting element 130C could slide to enter the groove 221*r* through the outlet 210*b* more smoothly.

In an embodiment, after one groove 221*r* is filled with the light-emitting element 130C, the light-emitting element 130C (if any) in the accommodating portion 210*r* could be emptied, and then another type of the light-emitting element with a different light color (for example, the light-emitting element 130A) is disposed within the accommodating portion 210*r*. Then, the carrying device 220 and the feeding device 210 could move relatively. For example, the carrying device 220 and the feeding device 210 move relatively in the X-axis so that another empty groove 221*r* or the next empty groove 221*r* is aligned with the channel P1. Then, the above-mentioned steps are repeated so that the light-emitting elements 130A within the accommodating portion 210*r* enter the groove 221*r* through the channel P1 until the groove 221*r* is filled with the light-emitting elements 130A. After one groove 221*r* is filled with the light-emitting elements 130A, the same step could be taken to fill the next groove 221*r* with the light-emitting elements 1306. In other words, in terms of three consecutive grooves 221*r*, after the first one of the three grooves 221*r* is filled with the first type of the light-emitting elements (for example, one of the light-emitting elements 130A, 1306 and 1306), the second one of the grooves 221*r* is filled with the second type of the light-emitting elements (for example, another of the light-emitting elements 130A, 1306 and 1306), and then the third one of the three grooves 221*r* is filled with the third type of the light-emitting elements (for example, the other of the light-emitting elements 130A, 1306 and 1306). All the grooves 221*r* are filled with the light-emitting elements 130 according to such principle, as shown in FIGS. 361 and 362.

In another embodiment, after one groove 221*r* is filled with the light-emitting elements 130C, the carrying device 220 and the feeding device 210 could move relatively. For example, the carrying device 220 and the feeding device 210 move relative to each other in the X axis so that another empty groove 221*r* is aligned with channel P1. Then, the same steps are repeated so that the light-emitting element 130C within the accommodating portion 210*r* enters the corresponding groove 221*r* through the channel P1. In other words, after all the light-emitting elements 130C within the accommodating portion 210*r* fill one or a plurality of the grooves 221*r*, another type of the light-emitting element (for example, the light-emitting element 130A) of different light color is disposed within the accommodating portion 210*r*. Then, the carrying device 220 and the feeding device 210 could move relatively. For example, the carrying device 220 and the feeding device 210 move relatively in the X-axis, so that another empty groove 221*r* is aligned with the channel P1. Then, the above-mentioned steps are repeated so that all light-emitting elements 130A within the accommodating portion 210*r* enter the corresponding groove 221*r* through the channel P1. All grooves 221*r* are filled with the light-emitting elements 130 according to such principle, as shown in FIGS. 3B1 and 3B2.

In addition, the embodiment of the present invention does not limit the filling order of the light-emitting elements 130A to 130C. In the present embodiment, the light-emitting elements within the same groove 221*r* all emit the same color light, but this is not intended to limit the embodiment of the present invention. The type of light-emitting elements within each groove 221*r* can be determined according to actual requirements. In another embodiment, the same groove 221*r* may be filled with light-emitting elements 130A to 130C, and the light-emitting elements 130A to 130C respectively emit lights of different colors.

As shown in FIG. 3C, the first heat conducting plate 222 and the groove structure 221 (the groove structure 221 is not shown) in FIG. 3B2 are separated, wherein the light-emitting elements 130 are located at or remain on the first heat conducting plate 222.

As shown in FIGS. 3D1 and 3D2, the heating device 260 is configured to heat the first heat conducting plate 222 to increase a pitch between adjacent light-emitting elements 130. Furthermore, there is a pitch $H_x$ between two adjacent light-emitting elements 130 in the X-axis, and a pitch $H_y$ between two adjacent light-emitting elements 130 in the Y-axis. After heating, the pitch $H_x$ and the pitch $H_y$ increase. In an embodiment, the pitch $H_x$ is substantially equal to the pitch $H_y$. After heating, the increment of the pitches among the light-emitting elements 130 has no directionality. Furthermore, after heating, the first heat conducting plate 222 expands uniformly in all directions, so the pitch $H_x$ and the pitch $H_y$ are substantially equal. Through heating, the pitches among the light-emitting elements 130 can be easily increased. In addition, although not shown, the aforementioned controller 250 could be electrically connected to the heating device 260 to control the heating device 260 to generate heat. In an embodiment, the heating temperature could range between 100° C. and 300° C. As a result, it could effectively adjust the pitch among the light-emitting elements 130 and avoids damage to the light-emitting elements 130 due to excessive temperature.

The first heat conducting plate 222 is, for example, an aluminum plate. At 20° C., the thermal expansion coefficient of aluminum is $23.5\times10^{-6}$/K. In case of the arrangement density of the light-emitting elements 130 on the first heat conducting plate 222 being 300 PPI (Pixels Per Inch) and the size of the light-emitting element 130 being 36 μm×18 μm as an example, if the first heat conducting plate 222 is heated to 220° C. from room temperature, the first heat conduction plate 222 of 4 $cm^2$ could be expanded, and the pitch between two adjacent light-emitting elements 130 disposed on the first heat conducting plate 222 could be increased by about 1.8 μm. Due to the pitch between two adjacent light-emitting elements being controlled by the principle of thermal expansion, the pitch could be controlled more precisely, and especially reduce an error generated when archiving a tiny pitch. In another embodiment, the first heat conduction plate 222 is not limited to the aluminum plate, and the first heat conduction plate 222 could be a copper plate or other plates with excellent thermal conductivity.

As shown in FIG. 3E, the light-emitting elements 130 adhere to the light-transmitting plate 140 through the adhesive layer 150 (the first adhesive layer) formed on the light-transmitting plate 140 (the first light-transmitting plate), and the light-emitting elements 130 is transferred to the light-transmitting plate 140, as shown in FIG. 3F. The adhesive layer 150 may include a pyrolytic glue or a non-pyrolytic glue. In addition, the light-transmitting plate 140 is, for example, a glass carrier.

As shown in FIG. 3G, the substrate 110 is provided, wherein a plurality of the electrical connection groups 120 are formed on the substrate 110. Then, the light-emitting elements 130A to 130C disposed on the light-transmitting plate 140 are transferred to the substrate 110, wherein each light-emitting element 130 is electrically connected to the corresponding electrical connection group 120. The connection relationship between the light-emitting element and the electrical connection group 120 has been described above, and it will not be repeated here.

To sum up, compared with the existing technology of transferring light-emitting elements by using rollers, due to the manufacturing method of the embodiment of the present invention using the light-transmitting plate 140 to transfer the light-emitting element 130 to the substrate 110, a pressure control for the light-emitting elements disposed on the light-transmitting plate 140 is relatively stable, and the soft adhesive layer 150 between the light-emitting element 130 and the light-transmitting plate 140 serves as a buffer, and thus it could reduce or even avoid damage to the light-emitting element caused by pressure control problem. Besides, the Mura effect (a phenomenon in which various vestiges are caused by uneven display brightness) could be improved by distributing the light-emitting elements 130 to the carrying device 220 through feeding device 210.

Then, the sealant 170 could be formed between the substrate 110 and the light-transmitting plate 140 in FIG. 3G (the sealant 170 is shown in FIG. 1C) to combine the substrate 110 with the light-transmitting plate 140 to form the display device 100 as shown in FIG. 10.

If the pitch between the two adjacent light-emitting elements cannot meet expectation after once heating, at least one more heating could be performed, as illustrated below.

Referring to FIGS. 4A to 4D, FIGS. 4A to 4D show schematic diagrams of processes of a manufacturing method of the display device 100 in another embodiment in FIG. 1.

The manufacturing method of the display device 100 in another embodiment is similar or the same as the aforementioned processes in FIGS. 3A1 to 3D2, and it will not be repeated here. The following will start with the process after FIG. 3D2.

Figure 4A:
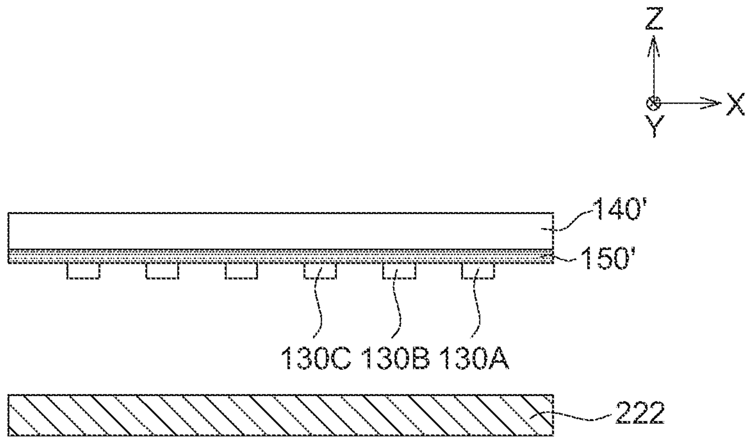
FIGS. 4A to 4D show schematic diagrams of processes of a manufacturing method of the display device in FIG. 1 in another embodiment.

As shown in FIG. 4A, after the heating step in FIG. 3D2, the light-emitting elements 130 disposed on the first heat conducting plate 222 in FIG. 3D2 could be bonded to the second light-transmitting plate 140' through the second adhesive layer 150' formed on the second light-transmitting plate 140'. The second adhesive layer 150' may include, for example, a pyrolytic glue. After the heating step in FIG. 3D2, these light-emitting elements 130A to 130C could quickly adhere to the second light-transmitting plate 140' within a time interval, for example, within a time interval of 0.5 seconds to 10 seconds. As a result, it could prevent the pitch between adjacent two light-emitting elements from being reduced due to cooling, and prevent the second adhesive layer 150' on the second light-transmitting plate 140' from reducing or losing its viscosity due to temperature rise.

Figure 4B:
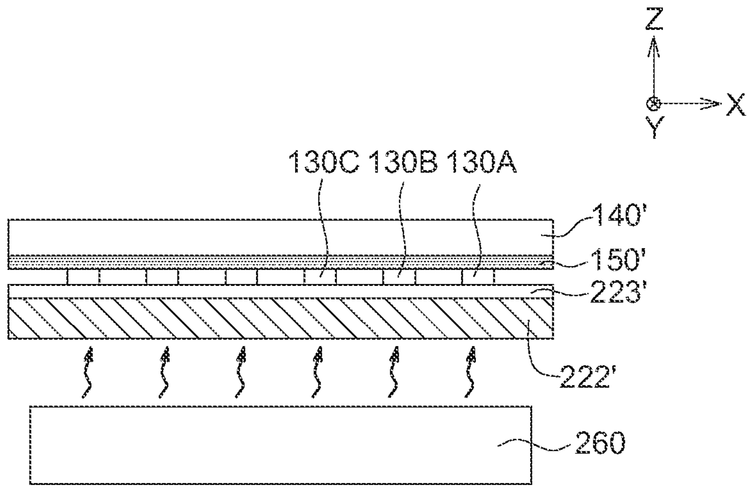

As shown in FIG. 4B, the light-emitting elements 130A to 130C disposed on the second light-transmitting plate 140' are transferred to the second heat conducting plate 222', wherein a third adhesive layer 223' is formed on the second heat conducting plate 222', and the light-emitting elements 130A to 130C may adhere to the third adhesive layer 223'. The third adhesive layer 223' is, for example, pyrolytic glue. In addition, the second heat conducting plate 222' is, for example, a metal carrier plate.

As shown in FIG. 4B, the controller 250 (not shown in FIG. 4B) could control the heating device 260 to heat the second heat conducting plate 222' so that the second adhesive layer 150' reduces or loses its viscosity, thereby making the light-emitting elements 130A to 130C detach from the second adhesive layer 150' easily. In an embodiment, the pyrolysis temperature of the third adhesive layer 223' is higher than the pyrolysis temperature of the second adhesive layer 150'. As a result, the second heat conducting plate 222' is heated to a temperature range higher than the pyrolysis temperature of the second adhesive layer 150' and lower than the pyrolysis temperature of the third adhesive layer 223' so that the viscosity of the second adhesive layer 150' is reduced or even lost due to heating, while the third adhesive layer 223' still remains viscous enough to adhere to the light-emitting elements 130A to 130C.

Figure 4C:
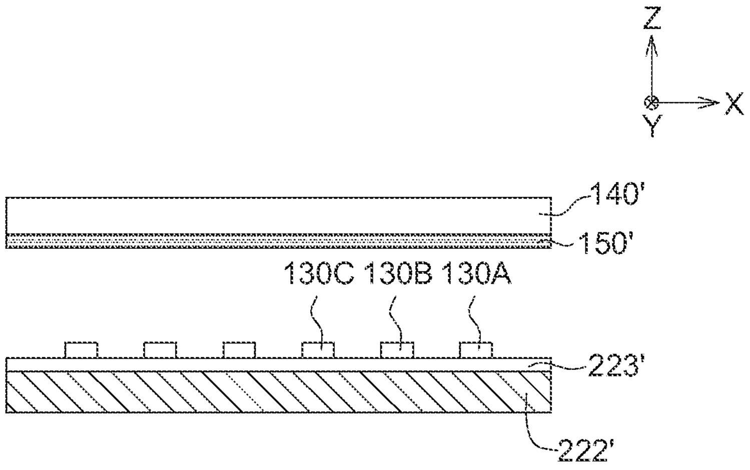

As shown in FIG. 4C, since the second adhesive layer 150' reduces or loses its viscosity while the third adhesive layer 223' still maintains its viscosity, the light-emitting element 130A to 130C are separated from the second adhesive layer 150' but still remains on the third adhesive layer 223' after the second adhesive layer 150' is separated from the light-emitting elements 130A to 130C.

Figure 4D:
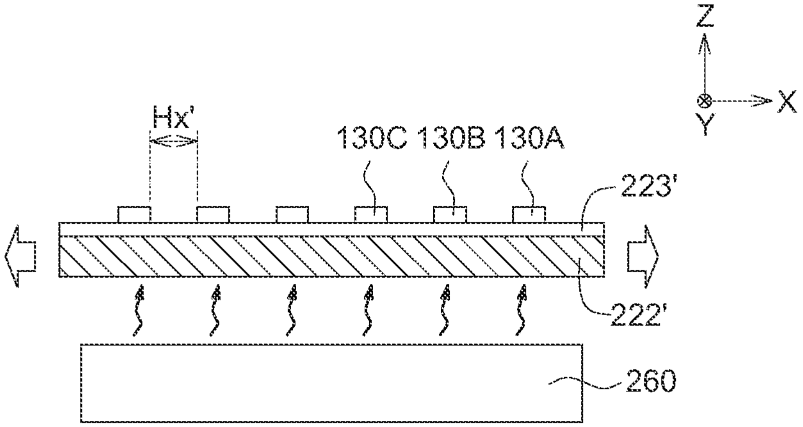

As shown in FIG. 4D, the controller 250 (not shown) could control the heating device 260 to heat the second heat conducting plate 222' to increase the pitch between two adjacent light-emitting elements. For example, the pitch H'X between two adjacent light-emitting elements in the X-axis and the pitch of two adjacent light-emitting elements in the Y axis are increased. The principle and mode of increasing the pitch have been described above, and it will not be repeated here.

If the pitch between two adjacent light-emitting elements still fails to satisfy expectations, the process in FIGS. 4A to 4D may be repeated until the pitch between two adjacent light-emitting elements satisfies expectations. When the pitch between two adjacent light-emitting elements satisfies expectations after heating, the aforementioned processes in FIGS. 3E to 3G could be adopted to form the display device 100.

To sum up, the embodiments of the present invention provide a display device, its manufacturing method and its manufacturing equipment. In the manufacturing method, the manufacturing equipment is configured to transfer a plurality of the light-emitting elements to the substrate. During the process, the pitch between two adjacent light-emitting parts is controlled by the principle of thermal expansion, and accordingly it can control the pitch more accurately, and especially reduce the error generated when achieving a tiny pitch.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A display device, comprising:

a substrate;

a plurality of electrical connection groups formed in the substrate;

a plurality of light-emitting elements disposed on the substrate, wherein each of the light-emitting elements is electrically connected to a corresponding electrical connection group of the electrical connection groups;

a light-transmitting plate covering the light-emitting elements; and an adhesive layer formed between the light-transmitting plate and each of the light-emitting elements and continuously bridging the light-emitting elements;

a patterned light-shielding layer formed on the substrate and having a plurality of recesses, wherein each of the recesses accommodates a corresponding light-emitting element of the light-emitting elements;

wherein the light-emitting elements form a plurality of pixels, and each of the pixels comprises three light-emitting elements of the light-emitting elements, the three light-emitting elements are different in light color, and the adhesive layer continuously bridges the pixels;

wherein the adhesive layer has a lower surface, the substrate has an upper surface, and there is a gap between the lower surface and the upper surface.

2. The display device as claimed in claim 1, further comprising:

a sealant combining the substrate with the light-transmitting plate, and surrounding the light-emitting elements.

3. The display device as claimed in claim 1, wherein the patterned light-shielding layer has a first top surface, each of the light-emitting elements has a second top surface, and the first top surface is higher than each of the second top surfaces.

4. The display device as claimed in claim 1, wherein each of the light-emitting elements comprises a first electrode and a second electrode, and the first electrode and the second electrode are located on the same side of the corresponding light-emitting element.

5. The display device as claimed in claim 4, wherein each of the electrical connection groups comprises:

a first transmission line; and a second transmission line connected to the second electrode of the corresponding light-emitting element;

wherein the first electrode of each of the light-emitting elements is connected to the first transmission line of the corresponding electrical connection group through a first conductive hole.

6. The display device as claimed in claim 5, wherein the substrate comprises:

a dielectric layer, wherein the first electrode and the second electrode of each of the light-emitting elements are disposed on the dielectric layer, the dielectric layer covers the first transmission line and the second transmission line of each of the electrical connection groups, and the first conductive hole penetrates the dielectric layer to connect a corresponding first electrode of the first electrodes with a corresponding first transmission line of the first transmission lines.

7. The display device as claimed in claim 6, wherein each of the electrical connection groups comprises a second conductive hole, the second conductive hole penetrates through the dielectric layer to connect a corresponding second electrode of the second electrodes with a corresponding second transmission line of the second transmission lines.

8. The display device as claimed in claim 4, wherein the first electrode of one of the light-emitting elements is shaped as a circle, an ellipse or a polygon.

9. The display device as claimed in claim 8, wherein the first electrode and the second electrode of one of the light-emitting elements are disposed concentrically, and the second electrode of the one of the light-emitting elements surrounds the first electrode of the one of the light-emitting elements.

* * * * *